United States Patent [19]

Kawamura et al.

[11] Patent Number: 4,949,293

[45] Date of Patent: Aug. 14, 1990

[54] METHOD AND APPARATUS FOR COMPUTING RESIDUE WITH RESPECT TO ARBITRARY MODULUS

[75] Inventors: Shinichi Kawamura; Kyoko Takabayashi, both of Yokohama, Japan

[73] Assignee: Kabushiki Kaisha Toshiba, Kawasaki, Japan

[21] Appl. No.: 248,041

[22] Filed: Sep. 23, 1988

[30] Foreign Application Priority Data

Sep. 25, 1987 [JP] Japan .................. 62-238856

[51] Int. Cl.$^5$ .......................................... G06F 7/72
[52] U.S. Cl. .......................................... 364/746
[58] Field of Search .......................................... 364/746

[56] References Cited

U.S. PATENT DOCUMENTS 3,980,874  9/1976  Vora ..................................... 364/746
4,538,237  8/1985  Circello ............................... 364/746
4,538,238  8/1985  Circello et al. ...................... 364/746
4,555,769  11/1985  Carter et al. ........................ 364/746

Primary Examiner—David H. Malzahn
Attorney, Agent, or Firm—Foley & Lardner, Schwartz, Jeffrey, Schwaab, Mack, Blumenthal & Evans

[57] ABSTRACT

A method and apparatus for computing a residue of a modulo-"a" number with respect to an arbitrary modulus, which require only a small memory capacity for the residue tables. The method obtains the residue by the iteration of dividing the modulo-"a" number into partitioned blocks of predetermined sizes and a remaining portion, finding the residues for partitioned blocks of the modulo-"a" number in the prepared residue table, and summing the remaining portion and the residues of the partitioned blocks with significant positions appropriately aligned. The apparatus for performing the method is also disclosed.

2 Claims, 5 Drawing Sheets

$M_2 = R_1 + R_2 + R_3 + Z_1$

METHOD AND APPARATUS FOR COMPUTING RESIDUE WITH RESPECT TO ARBITRARY MODULUS

BACKGROUND OF THE INVENTION

1. Field of the Invention

The present invention relates to a residue computing system for finding residues of numbers with respect to a given modulus, and particularly to a residue computing system which is capable of computing the residues at a high speed with small memory capacity.

2. Description of the Prior Art

In recent years, the use of cryptosystems to protect information against illegal access, wiretapping and alteration has been developed. Among various encryption techniques, a public key cryptosystem is advantageous because it can conceal the information and verify the writer of a message, i.e., it has a digital signature function.

The most promising public key cryptosystem to be used for IC cards, etc., may be an RSA public key cryptosystem, which was proposed by Rivest, Shamir and Adleman.

In the RSA public key cryptosystem, encryption and decryption are executed with the following algorithms:

$C = M^e \bmod n$ (encryption)

$M = C^d \bmod n$ (decryption)

where M and C denote a plaintext and a ciphertext, respectively, and e, d, and n are key informations. These computations are called the modulo-exponentiation.

To ensure the security of this cryptosystem, it is said that the keys n and d should be positive integers of two hundred decimal digits or more. However, as the key n becomes larger, an amount of computation will be increased.

The modulo exponentiation is always executed as a sequence of multiplication and modulo reduction so that the most time consuming portion of the modulo exponentiation is the computation of:

$R = M1 \times M2 \bmod n.$

To compute this at a high speed using a table look up technique, there is a conventional method which will be explained with reference to FIG. 1.

The conventional method shown in the FIG. 1 computes a residue of a number $M(=M1 \times M2)$ with respect to a modulus n at a high speed. A portion of the number M which is larger than the modulus n is divided into blocks r1, r2 and r3 each of several bits.

Residues of the blocks r1, r2 and r3 with respect to the modulus n are stored in advance in residue tables RAM1, RAM2 and RAM3, respectively. Therefore, residues R1, R2 and R3 corresponding to the blocks r1, r2 and r3 are read out of the tables RAM1, RAM2 and RAM3 and added to $Z_1$ which is a portion of the number M smaller than the modulus n, to reduce the number M. This operation is repeated until a residue of the number M is found.

The details of this technique is reported in "A Study on RSA parallel processing method" in "The Proceedings of the 1986 Work Shop on Cryptography and Information Security" by Naoya Torii, Mitsuhiro Higashi and Ryota Akiyama.

This conventional technique reduces $M(=M1 \times M2)$ by using the residue tables to execute the residue computation at a high speed. However, it has a drawback that the residue tables must have enormous capacities. Supposing the key n is 512 bits and a dividend 1024 bits, when the upper 512 bits of the dividend are divided into blocks, each of several bits, and residue tables should be prepared for these blocks. If the length of one block is four bits, the number of blocks will be 128 so that 128 residue tables need to be prepared. As a result, the residue tables may require a memory of one mega bit or more.

If the length of each block is decreased, the residue tables may require less memory, but a computation speed will be reduced. Further, if the size of each residue table is large, it is cumbersome to rearrange the table when the modulus n is changed.

There is another conventional method to obtain a residue at a high speed. This method uses a multiplication table to efficiently solve division problems. For example, a multiplication table for modulo-$2^k$ numbers is prepared with respect to divisions by the modulo-$2^k$ numbers to find residues. This method is disclosed in Japanese Patent Application Laid Open No. S62-11937.

According to this method, a time necessary for the computation of a residue is substantially inverse proportion to the parameter k. Therefore, a processing speed may be increased by increasing the parameter k. However, the size of the multiplication table is substantially increased in proportion to $2^k$. Namely, the size of the multiplication table is exponentially increased as the parameter k increases. However, due to hardware limitations, the parameter k cannot drastically be enlarged to increase the processing speed.

As described in the above, according to the conventional residue computing systems, residues of respective digits of numbers whose residues are to be found need to be stored in advance in memories. Therefore, the capacity of each memory needs to be increased considerably as each number which is subjected to the residue computation becomes large, thus increasing the size and cost of hardware.

SUMMARY OF THE INVENTION

An object of the present invention is to provide a residue computing apparatus which can perform a high-speed residue computation with a small storage means.

Another object of the present invention is to provide a residue computation method by which a high-speed residue computation can be performed with a simple residue computation apparatus.

According to an aspect of the present invention, there is provided a method of computing a residue R of an m-digit number M with respect to a g-digit modulus N, where both M and N are represented using an integer "a" as a radix, comprising the steps of:

(a) storing, in a memory means, at most $a^b$ different residues with respect to said modulus N, where b is a predetermined number;

(b) partitioning said number M on a shift register means into a b-digit block X obtained by a latch means for separating b most significant digits of said number M, and a remaining portion Z of $(m-b)$ digits;

(c) finding a residue Rx corresponding to said block X with respect to said modulus N by looking up in said memory means;

(d) aligning a least significant digit of said residue Rx with a q-th most significant digit of said remaining portion Z;

(e) adding said residue Rx and said remaining portion Z as aligned in step (d) to obtain a number Rq: and (f) taking said number Rq as a residue R of said number M when said number Rq has not more than q digits, but otherwise repeating steps (b) to (f) with said number Rq replacing said number M.

According to another aspect of the present invention, there is provided an apparatus for computing a residue R of an m-digit number M with respect to a q-digit modulus N, where both M and N are represented using an integer "a" as a radix, comprising:

shift register means for temporarily holding said number M;

memory means for storing at most $a^b$ different residues with respect to said modulus N, where b is a predetermined number;

latch means for partitioning said number M in a shift register means into a b-digit block X obtained by separating b most significant digits of said number M, and a remaining portion Z of (m−b) digits;

means for finding a residue Rx corresponding to said block X with respect to said modulus N by looking up in said memory means;

means for aligning a least significant digit of said residue Rx with a q-th most significant digit of said remaining portion Z;

adder means for obtaining a number Rq by adding said residue Rx and said remaining portion Z as aligned by said aligning means;

means for determining whether said number Rq has more than q digits;

means for taking said number Rq as a residue R of said number M when said number Rx has not more than q digits; and means for replacing said number M in said shift register means by said number Rx when said number Rx has more than q digits.

According to another aspect of the present invention, there is provided a method of computing a residue R of an m-digit number M with respect to a q-digit modulus N, where both M and N are represented using an integer a as a radix, comprising the steps of:

(a) storing, in a memory means, precomputed s-digit residues of at most $k*a^{b/k}$ different numbers with respect to said modulus N, where s, b and k are predetermined numbers;

(b) partitioning said number M on a shift register means into a block X of b digits obtained by a latch means for separating b most significant digits of said number M, and a remaining portion Z of (q−b) digits, where b is a number equal to s times k:

(c) partitioning said block X into k sub-blocks $Xi(i=1, \ldots, k)$, each of s digits;

(d) finding residues Ri corresponding to said sub-blocks Xi with respect to said modulus N by looking up said memory means;

(e) aligning least significant digits of the residues Ri with the q-th most significant digit of said remaining portion Z;

(f) adding said residues Ri and said remaining portion Z as aligned in (d) to obtain a number Rq; and (g) taking said number Rq as a residue R of said number M when said number Rq has not more than q digits, and otherwise repeating steps (b) to (g) with said number Rq replacing said number M.

According to another aspect of said present invention there is provided an apparatus for computing a residue R of an m-digit number M with respect to a q-digit modulus N, where both M and N are represented using an integer a as a radix, comprising:

shift register means for temporarily holding said number M;

memory means for storing precomputed s-digit residues of at most $k*a^{b/k}$ different numbers with respect to said modulus N, where s, b and k are predetermined numbers;

latch means for partitioning said number M in a shift register means into a block X of b digits obtained by separating b most significant digits of said number M, and a remaining portion Z of (q−b) digits, where b is a number equal to s times k;

means for partitioning said block X into k sub-blocks $Xi(i=1, \ldots, k)$, each of s digits;

means for finding residues Ri corresponding to said sub-blocks Xi with respect to said modulus N by looking in said memory means;

means for aligning least significant digits of said residues Ri with a q-th most significant digit of said remaining portion Z;

adder means for obtaining a number Rq by adding said residues Ri and said remaining portion Z as aligned by said aligning means;

means for taking said number Rq as a residue R of said number M when said number Rq has not more than q digits; and means for replacing said number M in said shift register means by said number Rq when said number Rq has more than q digits.

Other features and advantages of the present invention will become apparent from the following descriptions taken in conjunction with the accompanying drawings.

DETAILED DESCRIPTION OF THE PREFERRED EMBODIMENTS

Figure 1:
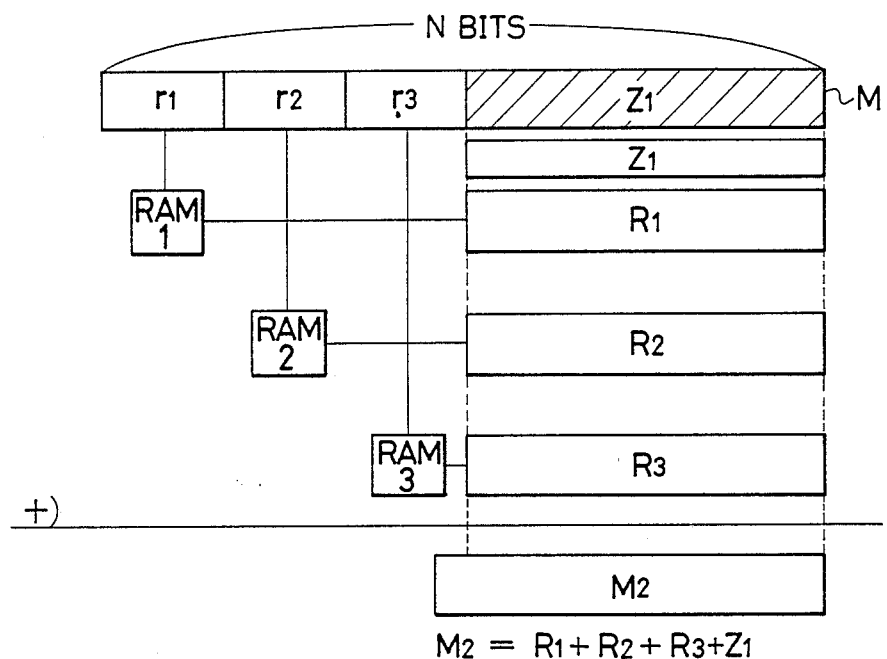
FIG. 1 is a diagram for explaining the principle of a conventional residue computation using residue tables.

Before describing embodiments of the present invention, a concrete example of the prior art residue computation of FIG. 1 will be described for better understanding of the principle of the present invention which will be explained later.

In this example, a residue (R) of a dividend (M1×M2=2048) with respect to a key (modulus) (n=7) is to be found. The residue can be expressed as follows:

$$R = M1 \times M2 \bmod n \quad (1)$$
$$2048 \bmod 7$$

In this example, the key (n) is of one decimal digit and the dividend (M1×M2) is of four decimal digits for the sake of simplicity. However, these are large numbers with many digits in practice.

The equation (1) will be resolved with the use of the following formulae to obtain an expression (2). (a+b) mod n≡, (mod n) (a·b) mod n≡ (a mod n)·(b mod n) (mod n). Note that "mod n" in the following formulae has two meanings; (1) a binary operator for finding a residue with respect to the modulus (n), and (2) a congruent relation with respect to the modulus "n".

$$R = 2048 \bmod 7 \quad (2)$$
$$\equiv (2000 \bmod 7 + 000 \bmod 7 + 40 \bmod 7 + 8) \pmod 7$$

Meanwhile, the following residue table is prepared in advance for the second, third and fourth digits.

| value | Fourth (RAM 1) | Third (RAM 2) | Second (RAM 3) |
|---|---|---|---|
| 1 | 6 | 2 | 3 |
| 2 | 5 | 4 | 6 |
| 3 | 4 | 6 | 2 |
| 4 | 3 | 1 | 5 |
| 5 | 1 | 3 | 1 |
| 6 | 1 | 5 | 4 |
| 7 | 0 | 0 | 0 |
| 8 | 6 | 2 | 3 |
| 9 | 5 | 4 | 6 |
| 0 | 0 | 0 | 0 |

In this table, a number "6" in the column of the fourth digit for the value 1 is obtained from the calculation of "1000 mod 7=6". Similarly, a number "5" in the column of the fourth digit for the value 2 is obtained from the calculation of "2000 mod 7=5", and a number "2" in the column of the third digit for the value 1 is obtained from the calculation of "100 mod 7=2". Generally, a number in the column of "a"th digit for a value "v" is obtainable from the calculation of "(v × 10$^a$) mod 7" (in the case of decimal notation).

With the use of this table, the equation (2) will be modified as follows:

$$\begin{aligned} R &\equiv (2000 \bmod 7 + 000 \bmod 7 + 40 \bmod 7 + 8) \pmod 7 \quad (3) \\ &\equiv (5 + 0 + 5 + 8) \pmod 7 \\ &\equiv 18 \bmod 7 \\ &\equiv (10 \bmod 7 + 8) \pmod 7 \\ &\equiv (3 + 8) \pmod 7 \\ &\equiv (11) \pmod 7 \\ &\equiv (10 \bmod 7 + 1) \pmod 7 \\ &\equiv (3 + 1) \pmod 7 \\ &\equiv 4 \pmod 7 \end{aligned}$$

This modification is carried out in the following steps; (1) the dividend is resolved into components based on respective digits, (2) residues of the respective components with respect to the modulus 7 are substituted from the residue table, (3) the sum of the residues is calculated, and (4) the procedure is repeated as many times as needed.

According to this prior art method, the number of RAMs needed for the table increases as the numbers of bits of the dividend (M1×M2) and key (n) increase. However, the number of bits of the dividend (M1×M2) and key (n) needed to be sufficiently large to provide effective encryption.

Now, the principle of the present invention which can improve a residue computation speed will be explained.

In the following explanation, a solution of "X mod N" is to be calculated. Generally, in calculating "X mod N", a quotient Q is found by dividing the dividend X by the divisor N, and "X mod N" is found through the calculation of "X−N·Q".

Although the multiplication of large numbers can be executed at high speed with parallel hardware, there is no parallel procedure for the division of large numbers so that the division takes a long time, which hinders a high-speed operation.

Instead of directly computing the division, the present invention keeps a congruent relation "$X_i \equiv X$ (mod N)" with respect to the modulus N, and modifies the relation from "X = $X_0$ to $X_0 \to X_1 \to X_2 \to \ldots$ ($X_0 > X_1 > X_2 \ldots$) to reduce the number of digits at a high speed. Generally, from a value $X_j$ of step j, a value $X_{j+1}$ of step j+1 satisfying the following equation is found at a high speed:

$$X_j \equiv X_{j+1} \pmod N \quad (X_j > X_{j+1}) \quad (4)$$

By dividing the value $X_j$ into blocks $X_i^{(j)}$ (i=1, 2, ..., lj) each of b ($\geq 2$) bits, the following is obtained:

$$X_j = \sum_{i=1}^{lj-1} X_i^{(j)} \cdot 2^{b(i-1)} \quad (5)$$

Here, $X_{j+1}$ is defined as follows:

$$X_{j+1} = \sum_{i=1}^{lj-1} X_i^{(j)} \cdot 2^{b(i-1)} + (X_{lj}^{(j)} \cdot 2^q \bmod N) \cdot 2^{tj} \quad (6.1)$$

$$tj = b \cdot (lj - 1) - q \quad (6.2)$$

The equation (6.1) is obtained by operating "mod N" with respect to only the most significant block $X_{lj}^{(j)}$. Here, "q" is the number of bits of modulus N and tj$\geq 0$. The equation (5) and (6.1) satisfy the equation (4). This will be demonstrated as follows.

$$X_j - X_{j+1} \quad (7)$$
$$X_{lj}^{(j)} \cdot 2^{b(lj-1)} - (X_{lj}^{(j)} \cdot 2^q \bmod N) \cdot 2^{tj}$$

If the right-hand side of the equation (7) is positive and is a multiple of N, it will be demonstrated that $X_j$ and $X_{j+1}$ defined by the equations (5) and (6.1) have the relation expressed with the equation (4). For this demonstration, suppose:

$$X_i^{(j)} \cdot 2^q \bmod N = r (0 \leq r \leq N-1)$$

Then, according to the definition of "mod" operation, a certain positive integer "k" exists which satisfies the following equation:

$$X_{lj}^{(j)} X_{(j)} \cdot 2^q = k \cdot N + r \quad (8)$$

Both sides of the equation (8) are multiplied by "$2^{ij}=b(lj-1)-q$" to obtain the following:

$$X_{lj}^{(j)} \cdot 2^q \cdot 2^{ij} = (k \cdot N + r) \cdot 2^{ij}$$

$$X_{lj}^{(j)} \cdot 2^{b(l-1)} = k \cdot N \cdot 2^{ij} \qquad \ldots (9)$$

The second term of the right-hand side of the equation (9) is transferred to the left-hand side and compared with the equation (7) to obtain the following:

$$X_j - X_{j+1} = 2^{ij} \cdot k \cdot N > 0 \qquad \ldots (10)$$

$$\therefore X_j = X_{j+1} (\text{mod } N)(X_j > X_{j+1}) \qquad \ldots (11)$$

Thus, it has been demonstrated that $X_j$ and $X_{j+1}$ satisfy the equation (4).

To obtain a solution of the equation (6.1) at a high speed when the equation (5) is given, the "mod" operation of the second term of the equation (6.1) may be computed and stored in a RAM in advance. If the value $X_{lj}$ has $lj$ bits, the value $X_{j+1}$ has only "$blj-b+1$" bits. Namely, through one time table lookup and addition, the residue computation can be reduced at least by "$b-1$" bits. From this, it is understood that the size of X can be reduced at a high speed by repeating the table lookup and addition.

For example if $X_j$ has "m" bits, $X_{j+1}$ may have "$m-b+1$" bits or smaller bits. The upper "b" bits of $X_{j+1}$ are used as an address to look up the table again, and the number of bits of $X_{j+1}$ may be reduced by about "$b-1$" bits to have "$m-2(b-1)$" bits or smaller bits.

The table lookup is continued until $X_j$ is reduced to a value smaller than the modulus N so that the computation of "X mod N" can be done at a high speed.

How to prepare the RAM table will be explained.

According to the equation (6.1), the RAM table needs to have values "$X_{lj}^{(j)} \cdot 2^q$ mod N" which are calculated and stored in advance. Since $X_{lj}^{(j)}$ is a block of "b" bits, "$X_{lj}^{(j)} \cdot 2^q$" will only be "$2^b$" numbers. Further, the values "$X_{lj}^{(j)} \cdot 2^q$ mod N" are each of at most "q" bits (equal to the number of bits of N). Therefore, the RAM is constituted such that the values "$X_{lj}^{(j)} \cdot 2^q$ mod N" are read out from the RAM with addresses $X^{(j)}$. Therefore, the capacity of the RAM will be "$q \cdot 2^b$" bits. This table constitution is the most typical one.

According to this method, the table size will be increased exponentially as the parameter "b" becomes larger. To avoid this problem, $X^{(j)}$ may be divided into a plurality of segments, and a plurality of tables may be prepared. This method will be explained in detail.

Each block of "b" bits is divided into $\lceil b/s \rceil$ segments ($\lceil b/s \rceil$ means a maximum integer which is greater than) for each of S bits. Each segment is represented with a reference mark $\xi k$. Namely, it is supposed as follows:

$$X^{(j)} = \sum_{k=1}^{\lceil b/s \rceil} \xi k \cdot 2^{s(k-1)}$$

A table is constituted such that:

$$\xi k \cdot 2^{s(k-1)} \cdot 2^q \text{ mod } N$$

can be read with the segments $\xi k$ as addresses. A table for each segment needs "q bits $\times 2^s$ words". Therefore, required total memory capacity is "$\lceil b/s \rceil \cdot q \cdot 2^s$" bits. Paying attention to "$2^{b/x} > \lceil b/x \rceil$", it is understood that the memory capacity can always be reduced by dividing a table into plural tables. However, a number of bits to be reduced from the number of bits of $X_j$ will be "$b-(\log_2 \lceil b/s \rceil +1)$" bits in the worst case.

Figure 2:
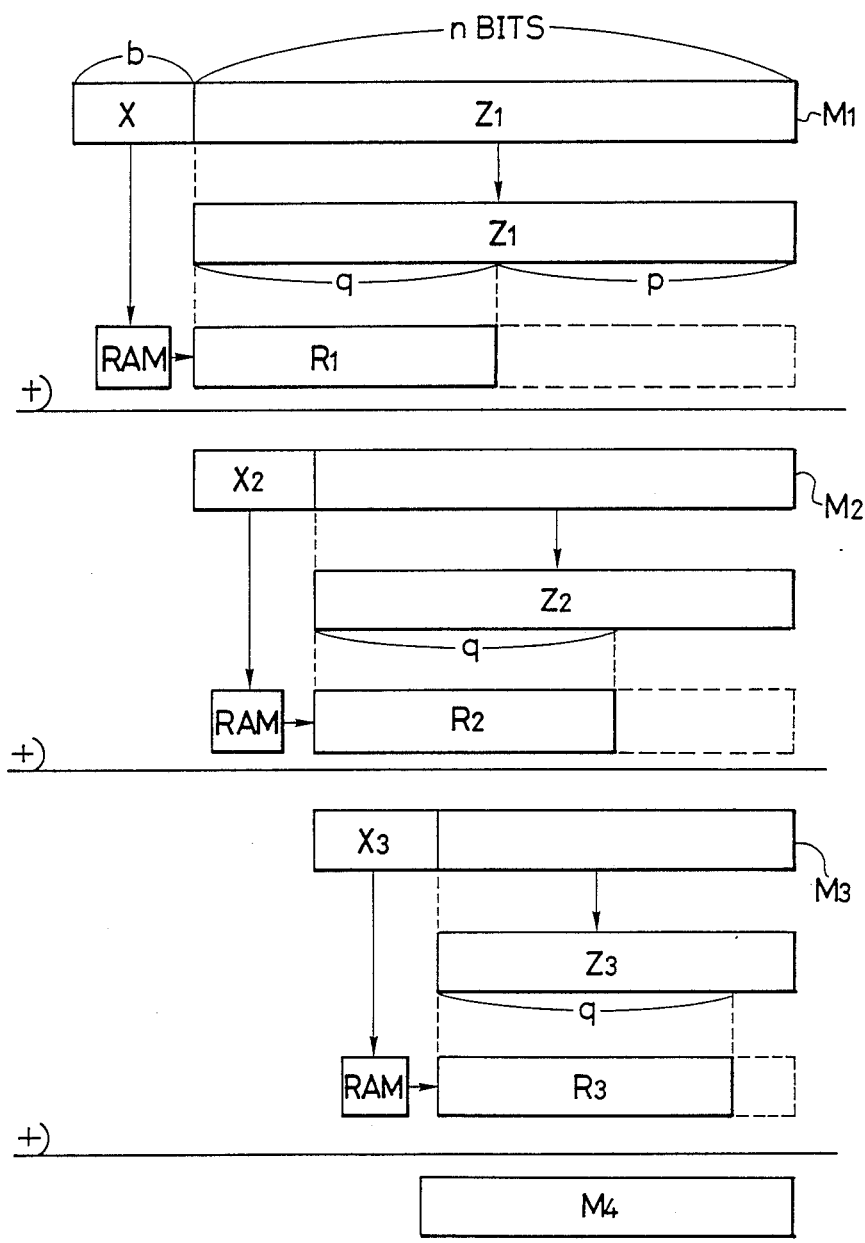
FIG. 2 is a diagram for explaining one embodiment of a residue computation method according to the present invention.

FIG. 2 is a block diagram showing a remainder computation method according to the first principle of the present invention.

In FIG. 2, a modulus N has "q" digits, and a dividend M is initially set as a number M1. A block X1 of "b" digits is picked out from the most significant bit (MSB) of the number M1 to leave a portion Z1. A residue R1 corresponding to the block X1 is read out of a RAM which is storing necessary residues. The residue R1 read out of the RAM is aligned with the remaining portion Z1, and they are added to each other. In aligning them with each other, the lowest position of the residue R1 is aligned with the "q"th position from the highest position of the remaining portion Z1. This alignment can easily be done by shifting the residue R1 and simply realized in hardware.

The added result is set as a number M2 which is subjected to the same process as that for the number M1. The process is repeated until the number to be processed becomes smaller than the modulus N.

An embodiment of the present invention according to the principle explained in the above will be described in comparison with the concrete example according to the first prior art method.

A solution of the following residue equation will be found:

$$Ri = X \text{ mod } N$$
$$= 2048 \text{ mod } 7$$

This equation can be resolved as follows:

$$Ri = 2048 \text{ mod } 7 \qquad (12)$$
$$= (20 \times 100 + 048) \text{ mod } 7$$
$$= \{(20 \text{ mod } 7) \times 100 + 48\} (\text{mod } 7)$$

Here, a residue table for the second digit numbers is prepared in advance as follows:

| Value | Second (RAM) |
|-------|--------------|
| 1 | 3 |
| 2 | 6 |
| 3 | 2 |
| 4 | 5 |
| 5 | 1 |
| 6 | 4 |
| 7 | 0 |
| 8 | 3 |
| 9 | 6 |
| 0 | 0 |

It is noted that in the prior art, tables for the third digit numbers and the fourth digit numbers are also prepared, but in this embodiment of the present invention only a table for the second digit numbers is needed.

According to this table, the equation (12) will be modified as follows:

$$Ri = \{(20 \text{ mod } 7) \times 100 + 48\} (\text{mod } 7) \qquad (13)$$
$$= (6 \times 100 + 48) (\text{mod } 7)$$

This equation (13) can be resolved as follows:

$$Ri = (6 \times 100 + 48) \pmod 7 \quad (14)$$
$$= 648 \pmod 7 \quad (14')$$
$$= (60 \times 10 + 48) \pmod 7$$
$$= \{(60 \bmod 7) \times 10 + 48\} \pmod 7$$

With the use of the residue table, the equation (14′) can be expressed as follows:

$$Ri = \{(60 \bmod 7) \times 10 + 48\} \pmod 7 \quad (15)$$
$$= (4 \times 10 + 48) \pmod 7$$
$$= 88 \pmod 7$$
$$= (80 + 8) \pmod 7$$
$$= \{(80 \bmod 7) + 8\} \pmod 7$$
$$= (3 + 8) \pmod 7$$
$$= 11 \bmod 7$$
$$= \{(10 \bmod 7) + 1\} \pmod 7$$
$$= (3 + 1) \pmod 7$$
$$= 4 \bmod 7$$

Then, the residue Ri can be obtained by calculating the equation (15). Namely, according to the method of the present invention, only the residue table for the second digit numbers is necessary so that the small residue table is sufficient to perform a high-speed residue computation.

Figure 3:
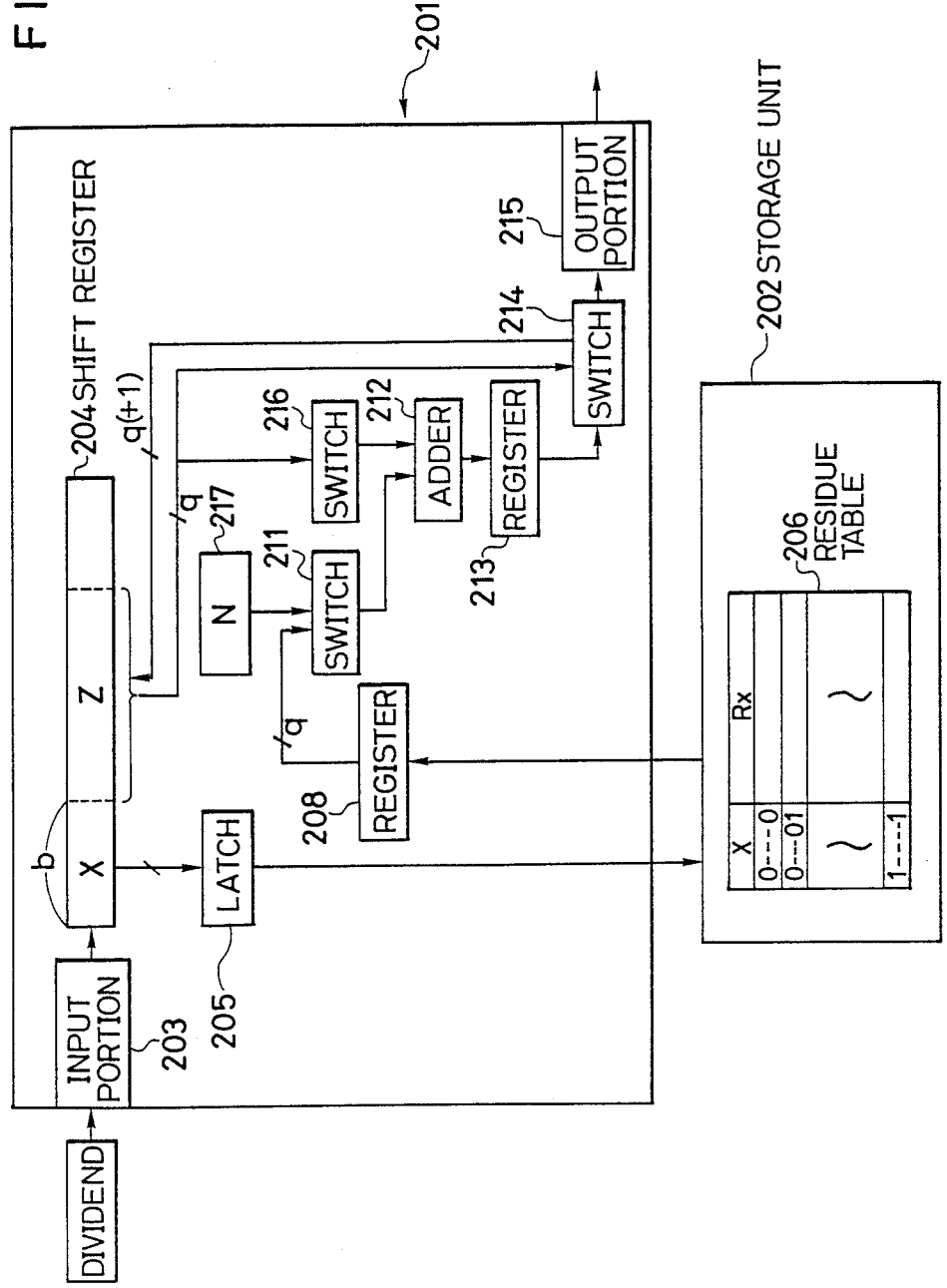
FIG. 3 is a block diagram of one embodiment of a remainder computing apparatus for performing a method according to the present invention.

FIG. 3 is a black diagram of a residue computing apparatus using the method of the present invention explained above. In FIG. 3, "q" is the number of digits of modulus N.

This apparatus comprises a computing unit 201 for carrying out a residue computation, and a storage unit (RAM) 202 which stores a residue table. The residue table stored in the storage unit 202 contains residues Ri of different modulo-"a" numbers ($a^b$ pieces) each of "b" digits.

A dividend M is input into an input portion 203, written in a shift register 204 and left-justified in the register 204. An upper block X1 of "b" digits of the data M written in the register 204 is used to look up the table stored in the storage unit 202. Namely, the block X1 is latched in a latch circuit 205 and output as an address for looking up the table in the storage unit 202.

The storage unit 202 comprises a residue table 206 and outputs a residue R1 corresponding to the block X1 to a register 208.

On the other hand, the block X1 of upper "b" digits in the register 204 is cleared from the register 204 to leave a portion Z composed of lower n digits excluding the block X1 of the dividend M. A block of "q" digits from the most significant bit of the portion Z is transferred to an adder 212 via a switch 216. In the adder 212, the block of "q" digits and the residue R1 are added to each other, and the added result (S1) is obtained in a register 213. In performing this adding operation, the residue R1 from the storage unit 202 is aligned with the block of "q" digits from the portion Z and added to it. Examples of this aligning operation are "6×100" in the equation (13) and "60×10" in the equation (14).

The added result S1 in the register 213 is transferred to the upper "q"th position of the portion Z in the shift register 204 via a switch 214. The added result S1 will have at most "q+1" digits. In this case, the extra most significant digit of the value S1 is placed at the upper "b"th position (the least significant position of the block X1) of the register 204. Since data below the upper "b+q"th of the shift register 204 are not affected by the above operation, the adder may be of substantially "q" digits.

Then, the contents of the shift register 204 will be set as M2. A control portion (not shown) shifts the contents of the shift register 204 toward the left to left-justify the value M2. The controller (not shown) checks to see whether or not an effective number of digits of M2 is smaller than "q+b". If it is larger than "q+b", the value M2 is set as a new dividend and processed.

The upper "b" bits of the dividend M2 is picked up as a block X2 to leave a remaining portion Z2. The block X2 is supplied to the storage unit 202 via the latch 205. A residue R2 corresponding to the block X2 is read out of the residue table 206 and transferred to the register 208. Then, the block X2 is cleared from the register 204, and the upper "q" digits of the remaining portion Z2 is applied to the adder 212 via the switch 216. In the adder 212, the upper "q" digits of the portion Z2 and the residue R2 from the register 208 are added to each other to obtain an added result S2. The added result S2 is written in the upper "q" digits (or "q+1" digits) of the register 204. The, the contents of the register 204 are set as a new dividend M3 and left-justified. A block X3 of upper "b" digits of the dividend M3 is picked up.

If the digit number "n" of M3 is larger than "q+b", the controller repeats the same process with the new dividend M3. However, if the number of digits of M3 is less than "q+b", the process of looking up the table is terminated. If the process is terminated, the value M3 obtained in the register 204 is a good approximation of a required value "$0 \leq M \bmod N \leq N-1$". However, it is larger than the required value by an integer multiple k of N (k is a small integer). This is corrected to obtain "M mod N". For example, the correction is done by sequentially reducing M3 by N. Then, M3 becomes negative at a certain point. The value just before becoming negative is a true solution of "M mod N".

This correction procedure may easily be realized with; (1) a register 217 of FIG. 1 for storing N, (2) a controller (not shown) for judging whether a value in the register 213 is positive or negative, (3) a bus for transferring a value in the register 204 to an output portion via the switch 214, etc.

In summary, the first embodiment of the present invention stores, with respect to modulo-"a" numbers M each of "n" digits, residues of "$X \cdot a^q \bmod N$" (the modulus N has "q" digits) in advance. Since the number of digits of the modulus N is "q", one residue has merely "q" digits. On the other hand, the number of residues to be stored is a function of the number "b" which is the number of digits of the dividend X. Namely, there are "$a^b$" residues. This "b" can be made smaller to reduce the size of the storage means to simplify the constitution and realize a high-speed residue computation.

Figure 4:
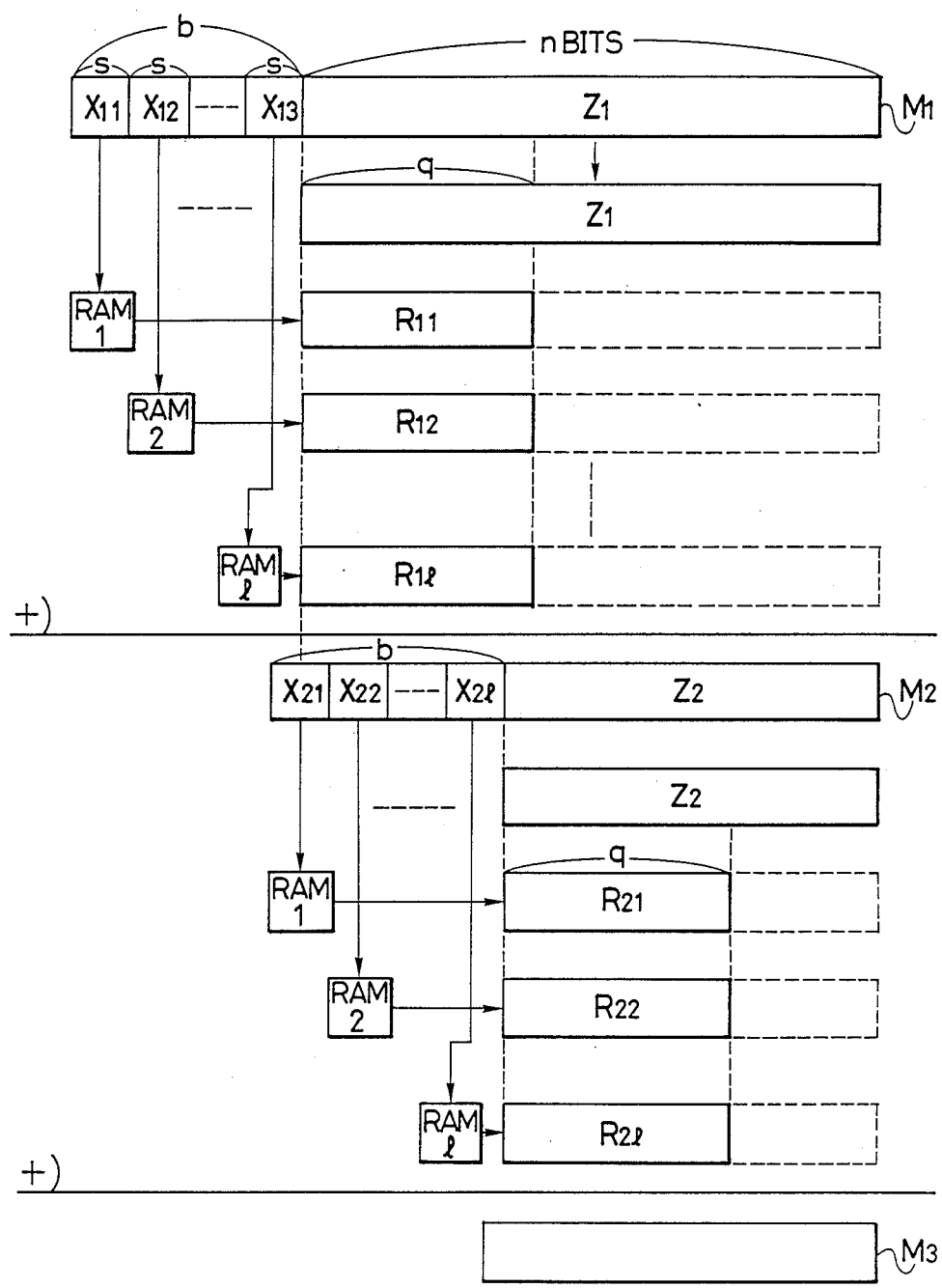
FIG. 4 is a diagram for explaining an embodiment of a residue computation method according to the present invention.
Figure 5:
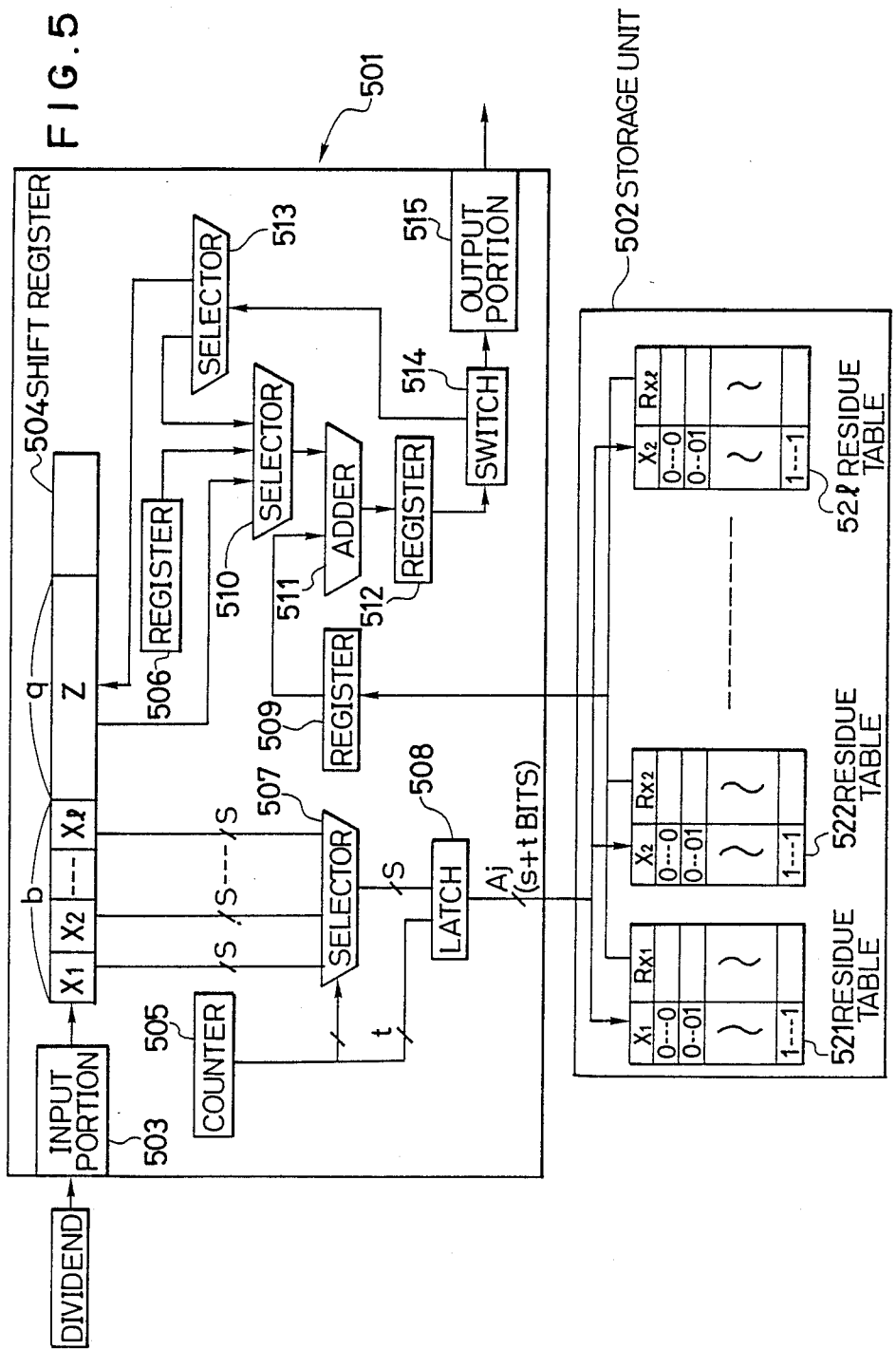
FIG. 5 is a block diagram of another embodiment of a remainder computing apparatus for performing a remainder computation method of FIG. 4 according to the present invention.

FIGS. 4 and 5 show another embodiment of the residue computing system according to the present invention.

Similar to the first embodiment, a reference mark N represents a modulus, and M a dividend of n digits. Firstly, the divided M is set as M1. In the first embodiment, a block X1 of predetermined digits has been separated from the most significant bit of M1 to read a residue of the block X1 out of a RAM.

According to the second embodiment, the block X1 is divided into segments each of "S" digits. The segments are represented with X11, X12, X13, ... X1l (l=b/s).

There are prepared "l" kinds of $RAM_j$ (j=1 to l) corresponding to the respective blocks X1j (j=1 to l) to store residues R11 to R1l corresponding to X1j.

To obtain M2 from M1 (M1>M2), the residues R11 to R1l are aligned with a portion Z1 which is the remaining portion of M1 excluding the segments X11 to X1l, and they are added to each other sequentially. This alignment operation is done by aligning the least significant positions of the respective residues R11 to R1l with the "q"th position from the most significant position of the portion Z1. In this way, the second embodiment is realized on the basis of the method explained at the beginning of "DETAILED DESCRIPTION OF THE EMBODIMENTS" where one block of a dividend is divided into several segments each of S bits. The method of calculating residues to be stored in the respective tables is the same as that explained at the beginning.

The added value is represented with a reference mark M2 which is successively processed with the same process as that for M1. Since the modulus is N, the process shall be repeated until the number of digits of Mj becomes smaller than the number of digits of N.

FIG. 5 is a block diagram of an apparatus for finding a residue according to the principle of the second embodiment. A reference mark "q" is the number of digits of N.

The apparatus shown in FIG. 5 comprises a computing unit 501 for carrying out the residue computation and a storage unit (RAM) 502 having residue tables storing residues Rxj. Each of the residues Rxj stored in the storage unit 502 is a residue of a modulo-"a" number Xj of "S" digits (the total number of the residues is $a^s$), and the residues are stored in "l" residue tables 521, 522, ..., 52l.

How to look up the residue tables in the "i"th iteration stage will be considered.

A dividend Mi is input into an input portion 503, written in a shift register 504 and left-justified in the register 504. An upper portion of "b (=l·S)" digits of the dividend Mi stored in the register 504 are divided into segments Xi1 to Xil each of "S" digits, and these segments are used as data for looking up the residue tables. Namely, a table lookup address Alj is prepared by concatenation of a value "j" from a counter 505 and a number Xj selected according to the value "j". For example, the firstly selected data X11 and a counter value 1 are latched to a latch circuit 508 which outputs a table lookup address A11 to the storage unit 502.

The storage unit 502 reads a residue R11 corresponding to the segment X11 according to the address A11, out of the residue table, and outputs the residue R11 to a register 509.

On the other hand, after outputting the segment X11 to the selector 507, the segment X11 of upper "S" digits in the register 504 is cleared. Then, the upper "q" digits of a portion Z1 are transferred to an adder 511 via a selector 510. Here, the portion Z1 represents the remaining portion of the dividend M1 excluding the upper "b" digits for the segments X11 to X1l. In the adder 511, the remainder R11 from the register 509 and the upper "q" digits from the portion Z1 are added to each other, and the added result is outputted to a register 512. The value in the register 512 is again transferred to the adder 511 via a switch 514, a selector 513 and the selector 510.

After clearing the segment X11, the segment X12 is selected by the counter 505 and selector 507 and latched to the latch circuit 508 to output a table lookup address to the storage unit 502. The storage unit 502 outputs a residue R12 corresponding to the address A12 out of the residue table 516 to the register 509. In the adder 511, the residue R12 from the register 509 and the previously added result from the selector 510 are added to each other, and the added result is output to the register 512. This operation is repeated up to the segment X1l.

The added result written in the register 512 is transferred to the shift register 504 via the switch 514 and selector 513 such that the "q+b"th position from the most significant bit of the contents of the shift register 504 is aligned with the least significant position of the added result. The lower "n-b-q" digits of the data in the shift register 504 are not affected by the above-mentioned operation. The contents of the shift register 504 thus obtained become a dividend M2 for the next processing stage.

The contents of the shift register 504 are shifted to the left until the most significant bit of the shift register 504 becomes 1. Namely, the dividend M3 is left-justified in the shift register 504. Then, the same operation as that for the first stage is carried out on the data M2. The upper "b" digits of the data M2 are divided into segments X21, X22, ..., X2l each of "S" digits. A controller (not shown) checks to see whether or not the number of digits of the data M2 is larger than "q+b". If the data M2 is larger than "q+b", the data M2 is processed as a dividend with the similar procedures. This is repeated until the number of digits of data Mk becomes smaller than "q+b".

If the number of digits of the data Mk is smaller than "q+b" and the data Mk is larger than the modulus N, correction is made similar to the first embodiment until the data Mk becomes smaller than the modulus N but larger than 0. Namely, the modulus N stored in a register 506 is transferred to the adder 511 via the selector 510. Then, the data Mk is transferred to the adder 511 via the switch 514 and selectors 513 and 510. In the adder 511, the value N is subtracted from the data Mk so that the data Mk becomes smaller than the data N. The result is written in the register 512, and given to an output portion 515 via the switch 514 to complete the process.

In summary, according to the second embodiment of the present invention, optimum remainder tables can be set according to the sizes of modulus N and dividend M.

Various modifications will become possible for those skilled in the art after receiving the teachings of the present disclosure without departing from the scope thereof.

What is claimed is:

1. An apparatus for computing a residue R of an m-digit number M with respect to a q-digit modulus N, where both M and N are represented using an integer "a" as a radix, comprising:

shift register means for temporarily holding said number M;

memory means for storing at most $a^b$ different residues with respect to said modulus N, where b is a predetermined number;

latch means for partitioning said number M in a shift register means into a b-digit block X obtained by separating b most significant digits of said number M, and a remaining portion Z of (m-b) digits;

means for finding a residue Rx corresponding to said block X with respect to said modulus N by looking up in said memory means;

means for aligning a least significant digit of said residue Rx with a q-th most significant digit of said remaining portion Z;

adder means for obtaining a number Rq by adding said residue Rx and said remaining portion Z as aligned by said aligning means;

means for determining whether said number Rq has more than q+b digits;

means for taking said number Rq as a residue R of said number M when said number Rq has not more than q+b digits; and means for replacing said number M in said shift register means by said number Rq when said number Rq has more than q+b digits.

2. An apparatus for computing a residue R of an m-digit number M with respect to a q-digit modulus N, where both M and N are represented using an integer a as a radix, comprising:

shift register means for temporarily holding said number M;

memory means for storing precomputed s-digit residues of at most $k*a^{b/k}$ different numbers with respect to said modulus N, where s, b and k are predetermined numbers;

latch means for partitioning said number M in a shift register means into a block X of b digits obtained by separating b most significant digits of said number M, and a remaining portion Z of (q-b) digits, where b is a number equal to s times k;

means for partitioning said block X into k sub-blocks $X_i (i=1, \ldots, k)$, each of s digits;

means for finding residues Ri corresponding to said sub-blocks Xi with respect to said modulus N by looking in said memory means;

means for aligning least significant digits of said residues Ri with a q-th most significant digit of said remaining portion Z;

adder means for obtaining a number Rq by adding said residues Ri and said remaining portion Z as aligned by said aligning means;

means for taking said number Rq as a residue R of said number M when said number Rq has not more than q+b digits; and means for replacing said number M in said shift register means by said number Rq when said number Rq has more than q+b digits.

* * * * *